Sept. 5, 1967 F. J. SAIA ETAL 3,339,274

TOP CONTACT FOR SURFACE PROTECTED SEMICONDUCTOR DEVICES

Filed March 16, 1964

INVENTORS,
FRANK J. SAIA,
DOROTHY F. JAMES,
LUCILLE G. HAMMOCK,
BY Charles S. Haughey
ATTORNEY.

United States Patent Office 3,339,274
Patented Sept. 5, 1967

3,339,274
TOP CONTACT FOR SURFACE PROTECTED SEMICONDUCTOR DEVICES

Frank J. Saia, Costa Mesa, Dorothy F. James, Huntington Beach, and Lucille G. Hammock, Santa Ana, Calif., assignors to Hughes Aircraft Company, Culver City, Calif., a corporation of Delaware Filed Mar. 16, 1964, Ser. No. 352,150
2 Claims. (Cl. 29—578)

ABSTRACT OF THE DISCLOSURE

Formation of a semiconductor device having a raised contact extending above a glass covered device surface.

This invention relates to surface protected semiconductor devices, and is particularly useful in making a top contact to a semiconductor diode or transistor.

In the development of the semiconductor art it has become feasible and quite common to protect the surface of semiconductor devices with oxide masking films, particularly in the vicinity of P-N junction edges on planar surfaces. Such protection generally consists of silicon dioxide either deposited on the surface, or in the case of silicon crystal material, grown by oxidation of the crystal surface. Such films have been a source of many troubles in that too thick films tend to crack or craze and deteriorate, and may be subject to differential thermal expansion problems. Too thin films are inadequate for surface protection against processes of manufacture. To avoid the problems of oxide masking film technology attempts have been made to utilize glass films, with varying results. A very good match of thermal expansion properties is required in a glass having no deleterious elements or impurities in its composition. It has been found that some otherwise objectionable glass constituents, such as boron, may be tolerated if the glass is laid over an oxide masking film of sufficient thickness such as $SiO_2$. The masking film protects the device crystal surface, and the glass seems to protect, and may in fact alloy with, the masking film, but need not penetrate so much that boron or other glass impurities will degrade the semiconductor crystal surface.

When a suitable masking film is produced on a semiconductor crystal surface, it is generally necessary to make ohmic contact with a junction-forming region at the surface. This requires forming a metal lead through the surface film, of glass or $SiO_2$, or an alloy or mixture thereof, without deteriorating the film, or the device. Ultrasonic drilling through glass tends to damage crystal structure below and require imprecise etch removal of damaged crystal material; photo masking and etching techniques multiply registration problems and increase expense, and deep etching to cut the masking film may deteriorate the protective film. Producing the metal contact after the opening has been made in the masking film presents problems which have been attacked many ways without significant practical success.

This invention presents a simple and economical solution to the problem of producing a semiconductor crystal device having a passivated planar surface with an ohmic contact therethrough to the crystal, and provides a method for producing a metal ohmic contact to the crystal surface before completing the surface passivating, or masking film, and subsequently exposing the metal contact without difficult chemical or mechanical problems.

Other advantages and characteristics of this invention will become apparent from the description and explanation of the invention.

For consideration of what I believe to be novel and my invention, attention is directed to the following portion of this specification, including the drawings, which describes the invention and the manner and process of making and using it.

Figure 1:
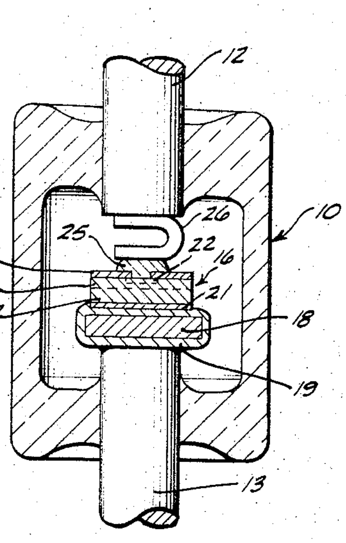
FIG. 1 is a cross-sectional elevational view of a packaged semiconductor device fabricated according to this invention.

The packaged device illustrated in FIG. 1 comprises a semiconductor diode device 16 in a standard commercial glass coaxial lead package 10 comprising coaxial leads 12 and 13 extending from a tubular glass envelope 11 and hermetically sealed thereto. The diode device 16 may be mounted within the coaxial glass package in any suitable manner as is common in the art. As illustrated, the device 16 comprises a die of a semiconductor crystal 17 having a metallic button contact 25 on one side thereof electrically connected to lead 12 through a C-shape whisker 26. The reverse side of the crystal die 17 is ohmically bonded to a tin clad copper plate 18 which in turn is ohmically bonded to lead 13.

Although the semiconductor diode device 16 is illustrated in FIG. 1 as incapsulated in a standard hermetically sealed coaxially sealed glass package, as subsequently appears the device 16 contains within its structure an adequate protective seal against ambient conditions, and is therefore mounted in the coaxial glass package primarily for convenience in handling and for reliability benefits of the double seal structure.

The semiconductor device 16 is produced by forming a raised "bump" of metal on the semiconductor surface to which ohmic contact is desired, then forming a layer of insulating, or masking, material over the surface and the metal bump. The thickness of the insulating layer is less than that of the metal bump, so that the bump protrudes over the level of the layer on the crystal surface. This surface is then levelled as by grinding, to expose the metal of the bump while leaving the insulating layer intact on the surface. Electrical contact may be made to the exposed metal surface in any preferred way, but it is preferred to deposit an additional volume of metal thereon to produce a bump or pedestal of substantial size to which electrical connection can be more easily made.

As illustrated in greater detail in FIGS. 2, 3, 4, 5 and 6, the semiconductor diode device 16 may be produced, by way of illustration, in the following preferred process.

Figure 2:
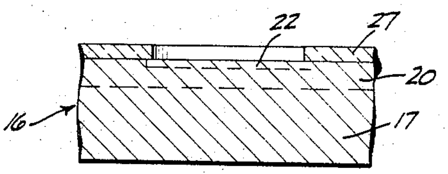
FIGS. 2, 3, 5 and 6 are cross-sectional elevational views of a portion of the device of FIG. 1 at successive steps during the fabrication thereof.

A silicon semiconductor crystal slice 15 is prepared, which, for this example, shall be of N+ conductivity type of perhaps .005 to .010 ohm centimeters resistance, and having a total thickness of the order of 6 mils. An epitaxial layer 20 has been grown on the surface of the slice 15, the layer 20 being of N-type and may be of the order of 1 to 10 ohm centimeters resistivity. While a single device die is illustrated in FIGS. 1–3 and 5 and 6, it is to be understood that there will customarily be several hundred devices produced simultaneously on a given crystal slice to be subsequently separated into individual device dies. In fabricating a silicon semiconductor diode according to this invention, the slice 15 is covered with a film suitable for masking in an impurity diffusion process. As shown in FIG. 2 a silicon dioxide film 27 of about 1 to 2 microns thickness is grown over the epitaxial layer 20 as by exposure at about 1,000° C. for 16 hours to an ambient atmosphere of steam and argon gas. The oxide film 27 has an opening therein which may be produced by photochemical masking and subsequent etching processes such as illustrated in U.S. Patents 2,981,877 to Noyce and 3,025,589 to Hoerni. After making the opening in the oxide film 27, a P-type conductivity type determining impurity such as boron is diffused through the opening and into the epitaxial layer 20 of the crystal to convert a region 22 thereof adjacent the opening to P-type. This process is illustrated in said Hoerni patent and U.S. Patent 2,802,760 to Derick and Frosch. Alternatively, for purpose of this invention, an impurity type determining material could be alloyed into the crystal through the opening of film 27 to form a region 22 of P-type, after which the excess alloy could be removed to produce a substantially planar surface on the crystal 17. After formation of P-type region 22 the opening in the film 27 is closed by the formation of a second masking film 28, which may be $SiO_2$ produced by the same process as that used to form the first film 27. A second opening is made in the regrown film 28 within the area of the original opening whereby to leave a portion of the new film 28 and the original film 27 extending over the P-N junction formed between the P-type region 22 and the adjacent N-type portion of the epitaxial layer 20. The second opening may be formed by a photochemical photo process such as was used to form the original opening.

An electrical contact metal such as silver is next deposited within the second opening in the oxide film 28 by any suitable process, such as by electro-plating, as is well-known in the art. For example, an electro-plating solution may be placed upon an absorbent pad such as cotton wadding wrapped around an electrically conductive core such as carbon and contacted to the P-type region through the opening in the film 27, 28 and the opposite electrode of the electro-plating system is contacted to the reverse side, or N-type portion, of the crystal die 16. Plating is allowed to proceed until a substantial deposit of metal has been produced, preferably exceeding the thickness of the film 27, 28 several times to produce a bump extending above the oxide film. If desirable a second metal such as gold may be plated on the silicon crystal before or simultaneously with the metal forming most of the bump for improved adhesion of the metal to the crystal, or to facilitate wetting and subsequent alloy bonding.

Figures 3, 4, 5:
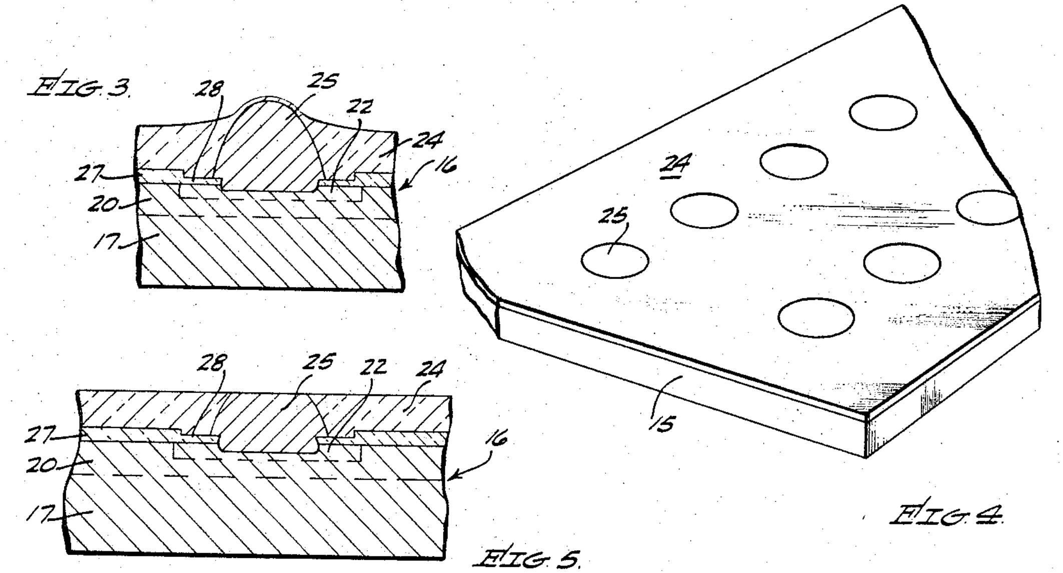
FIG. 4 is a perspective view of a crystal slice during fabrication at the step of FIG. 5.

The deposited bump 25 is preferably of the order of ½ mil thickness, or about 12 microns, as compared to about 1 to 2 microns thickness of the oxide film. A layer of glass frit, composed of glass particles preferably substantially less than 10 microns in diameter, is next coated upon a surface of the crystal. The glass composition is selected for thermal expansion characteristics matching those of the crystal material, and for silicon material a borosilicate glass is a quite suitable match. Glasses sold under the identification of Corning 7040 or Corning 7070 by Corning Glass Works, Corning, New York has thermal expansion characteristics matching very closely those of silicon semiconductor material and may be used in this step. The glass frit may be applied by coating the crystal with a dispersion of the frit in methanol in a centrifuge. The coated slice is next subjected to a sintering operation during which the glass film is fused to the oxide film 27, 28 to form a film 24 predominately of glass of the order of ½ mil or 10 microns thickness. The sintering in this example may be at about 900° C. to 5 to 10 seconds or at about 850° C. for 5 minutes during which the deposited silver bump 25 will alloy slightly into the P-type region 22 of the crystal and dissolve a small portion of silicon. It will also form a button shape extending over the edges of the oxide film 27, 28, as shown in FIG. 3 and rounded by surface tension effects to produce a bump under the glass film 24. The sintering temperature has been shown below the silver melting point but above the silver-silicon eutectic to produce a controlled penetration of the crystal and a suitable fusing of the glass and the silver button.

The fusing and glass sintering step is done with silver and glass frit volume proportions carefully controlled to produce a silver bump 25 higher than the resultant average glass film 24 level, even though the glass will normally extend over the silver bump as shown in FIG. 3. The slice 15 is next mounted in a grinder, and the tops of the bumps ground off by a polishing operation. Grinding goes rapidly while the exposed bumps are being ground, but when the surface of the glass film 24 is reached, grinding slows markedly. This grinding step is thus virtually self-limiting. The slice after the grinding step is illustrated in FIG. 4, showing a slice segment with exposed silver areas in the glass film. If the step between the oxide films 27, 28 is pronounced, it will be visible through the glass as a ring encircling the silver 25. The step structure, and the ground surface, are shown in FIG. 5, a sectional view of FIG. 4 taken through a contact 25 thereof.

Although complete device structure is now present, it is preferred to further process the slice to enlarge the silver contact area for the P-type region 22, and for other purposes.

Figure 6:
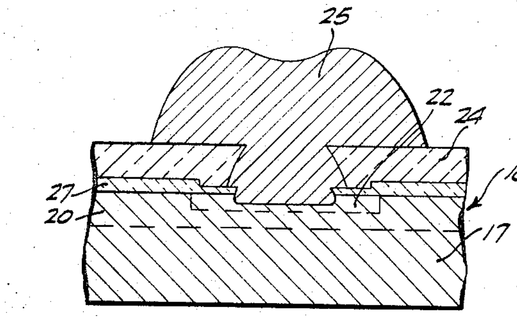

An additional volume of silver is accordingly plated over and onto the silver 25 to substantially extend the volume of the silver bump to form an enlarged silver metal button contact 25 as is shown in FIG. 6.

After the diode device 16 of FIG. 6 has been produced, it may be assembled into a circuit by attaching suitable leads to the button 25 connected to the P-type region 22 and to the back side of the die 17 in contact with the N-type region. Such connections are conveniently illustrated in FIG. 1 wherein the diode 16 is alloy bonded to a tin clad copper plate 18 by a tin-copper-gold silicon alloy generally formed by heating a tin coated copper plate in contact with a silicon die to form a tin copper silicon soldered alloy 21. A copper tin alloy 19 bonds the copper plate 18 to the lead 13. A C-shape-platinum element 26 attached to lead 12 contacts the button 25 and may either be spring biased in contact therewith, or may be alloyed thereto. Such alloying is commonly done by an electrical pulse passed through the assembly after sealing the diode device 16 into the coaxial tubular glass package 10.

In the completed structure of device 16, the masking film, here $SiO_2$, serves to passivate the crystal surface and protects it from diffusion or migration of impurities such as boron from the glass layer thereon. The double oxide layer 27, 28 allows the metal contact to be suitably spaced from the P-N junction, and thus improves back voltage and other characteristics and markedly improves yield and reliability due in part to avoidance of shorts across the junction. The combination of silicon crystal, silver contact, $SiO_2$ film and borosilicate glass provides a unique relationship of thermal expansion matching of glass and crystal, of surface protection between crystal and glass and of sealing and bonding efficiency between crystal glass and metal. Further, this structure is thermally stable and may be subjected to relatively high temperatures in further processing, assembly or packaging.

What is claimed is:

1. A method of manufacturing semiconductor devices which comprises:

(a) forming a masking film on a surface of a semiconductor wafer of one conductivity type;
(b) forming an opening in the film;
(c) forming in the wafer adjacent the opening a region of opposite conductivity type which region forms with the adjacent portion of the wafer a P-N junction;
(d) depositing a metal contact on the wafer through the opening and extending substantially above the surface level of the masking film;
(e) forming a film of glass on and adherent to the masking film and the exposed surface of the metal contact, with the top of the metal contact extending above the general level of the glass film;

(f) removing the glass film from the top of the coated contact to expose the metal thereof; and (g) depositing additional metal on said metal contact to enlarge the same.

2. The method of claim 1 comprising:

heating the assembly to bond the additional metal to the adjacent metal and glass surfaces.

References Cited

UNITED STATES PATENTS

| | | | |
|---|---|---|---|
| 2,948,051 | 8/1960 | Eisler | 29—155.5 |
| 3,199,002 | 8/1965 | Martin | 29—155.51 X |
| 3,212,160 | 10/1965 | Dale | 29—25.3 |
| 3,226,612 | 12/1965 | Haenichen | 317—234 |

WILLIAM I. BROOKS, *Primary Examiner.*